United States Patent
Lin et al.

(10) Patent No.: US 9,142,268 B2
(45) Date of Patent: Sep. 22, 2015

(54) DUAL-VOLTAGE DOMAIN MEMORY BUFFERS, AND RELATED SYSTEMS AND METHODS

(71) Applicant: QUALCOMM Incorporated, San Diego, CA (US)

(72) Inventors: Jentsung Lin, San Diego, CA (US); Paul D. Bassett, Austin, TX (US); Manojkumar Pyla, San Diego, CA (US); Robert A. Lester, Austin, TX (US); Christopher E. Koob, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 146 days.

(21) Appl. No.: 13/719,881

(22) Filed: Dec. 19, 2012

(65) Prior Publication Data
US 2013/0182515 A1 Jul. 18, 2013

Related U.S. Application Data

(60) Provisional application No. 61/587,266, filed on Jan. 17, 2012.

(51) Int. Cl.
*G11C 7/00* (2006.01)
*G11C 7/10* (2006.01)
*G06F 5/10* (2006.01)

(52) U.S. Cl.
CPC ............... *G11C 7/1084* (2013.01); *G06F 5/10* (2013.01)

(58) Field of Classification Search
USPC ............................. 365/189.15, 189.16, 189.05
See application file for complete search history.

(56) References Cited

U.S. PATENT DOCUMENTS

| | | | | |
|---|---|---|---|---|
| 5,345,419 A | * | 9/1994 | Fenstermaker et al. | . 365/189.04 |
| 5,388,074 A | * | 2/1995 | Buckenmaier | ........... 365/189.05 |
| 7,180,784 B2 | * | 2/2007 | Ju | .............. 365/185.22 |
| 7,437,582 B1 | | 10/2008 | Parlour | |
| 7,477,553 B2 | * | 1/2009 | Panades | .................. 365/189.12 |
| 7,594,088 B2 | * | 9/2009 | LaBerge | ....................... 711/167 |
| 7,733,127 B2 | | 6/2010 | Wingen | |
| 8,015,426 B2 | | 9/2011 | Vanstee et al. | |
| 8,064,256 B2 | | 11/2011 | Norman | |

(Continued)

OTHER PUBLICATIONS

International Search Report and Written Opinion—PCT/US2013/021828—ISA/EPO—May 10, 2013.

(Continued)

*Primary Examiner* — Pho M Luu
(74) *Attorney, Agent, or Firm* — Peter Michael Kamarchik; Nicholas J. Pauley; Paul Holdaway (57) ABSTRACT

Dual-voltage domain memory buffers, and related systems and methods are disclosed. To reduce area needed for voltage level shifters for voltage level shifting, latch banks are provided in a voltage domain of memory buffer read circuitry, separate from the voltage domain of a write data input to the latch banks. A write data input voltage level shifter is disposed between the write data input and the latch banks to voltage level shift write data on the write data input to the voltage domain of the latch banks. In this manner, voltage level shifters are not required to voltage level shill the latch bank outputs, because the latch banks are in the voltage domain of the memory buffer read circuitry. In this manner, semiconductor area that would otherwise be needed for the voltage level shifters to voltage level shift latch bank outputs is not required.

24 Claims, 10 Drawing Sheets

(56) References Cited

U.S. PATENT DOCUMENTS

| | | |
|---|---|---|
| 8,239,607 B2 * | 8/2012 | LaBerge .................. 711/5 |
| 2004/0049604 A1 | 3/2004 | Nation et al. |
| 2007/0097771 A1 | 5/2007 | Chu et al. |
| 2008/0137465 A1 | 6/2008 | Katayama |
| 2010/0138684 A1 | 6/2010 | Kim et al. |
| 2010/0157697 A1 | 6/2010 | Sato |

OTHER PUBLICATIONS

Taiwan Search Report—TW102101891—TIPO—Mar. 13, 2015.

* cited by examiner

DUAL-VOLTAGE DOMAIN MEMORY BUFFERS, AND RELATED SYSTEMS AND METHODS

PRIORITY CLAIM

The present application claims priority to U.S. Provisional Patent Application Ser. No. 61/587,266 filed on Jan. 17, 2012, and entitled "Dual-Voltage Domain Asynchronous FIFO Design To Reduce Area, Power, Timing, Routing Issues," which is incorporated herein by reference in its entirety.

BACKGROUND

I. Field of the Disclosure

The field of the disclosure relates to memory buffers, and particularly to dual-voltage domain asynchronous memory buffers.

II. Background

A memory buffer is a commonly used memory device to control data flow asynchronously. Data is stored in the memory buffer by a write device until ready to be streamed out of the memory buffer to a reading device. For example, a memory buffer may control flow of data sent from input/output (I/O) devices through universal asynchronous receivers/transmitters (UART) as a writing device to a central processing unit (CPU) as a reading device, or vice versa. A memory buffer may also be provided in other types of processors, such as digital signal processors (DSPs) for example. The memory buffer stores incoming data from the UART until the processor is ready to receive the data. The memory buffer streams the stored data received from the UART to the processor. For example, if the memory buffer is a FIFO memory buffer, the memory buffer streams the stored data out of the memory buffer in FIFO order. Other order schemes for streaming data may also be employed. Another example is a last-in, first-out (LIFO) data streaming order scheme. A memory buffer may also be employed to control flow of data from a processor to an I/O device. In this scenario, the memory buffer stores incoming data from the processor until the UART is ready to receive the data. The memory buffer streams the stored data received from the processor to the I/O device.

Figure 1:
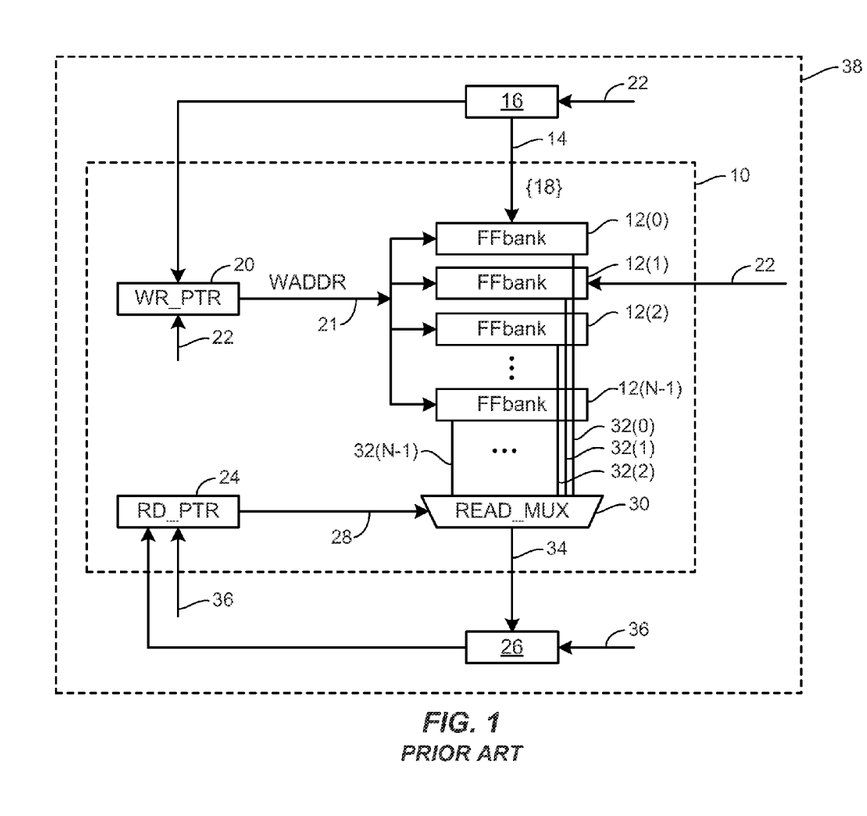
FIG. 1 is an exemplary asynchronous first-in, first-out (FIFO) memory buffer provided in the prior art.

An example of a FIFO memory buffer 10 is illustrated in FIG. 1. As illustrated in FIG. 1, the FIFO memory buffer 10 includes a plurality of latch banks 12(0)-12(N-1) (wherein 'N' is a positive whole number such that the number of the plurality of latch banks is "N"). The latch banks 12(0)-12(N-1) may include flip-flop latch banks, labeled as "FFbank" in FIG. 1. The latch banks 12(0)-12(N-1) in this example are configured to hold data, such as a bit, byte, or word of data. A data input 14 is provided by a write device 16 to provide incoming data 18 to be written into one of the latch banks 12(0)-12(N-1) in the FIFO memory buffer 10. The write device 16 provides a write pointer 20 (WR_PTR) that provides a write address (WADDR) on a write pointer output 21 to select a specific latch bank 12(0)-12(N-1) into which the incoming data 18 is to be written.

With continuing reference to FIG. 1, the write device 16, the write pointer 20, and the latch banks 12(0)-12(N-1) are all clocked by a write clock signal 22. A read pointer 24 (RD_PTR) is provided by a read device 26 as a read address (WADDR) on a read multiplexor selector 28 into a read multiplexor 30 (READ_MUX). The read multiplexor 30 selects a specific latch output 32(0)-32(N-1) to read out data from a corresponding latch bank 12(0)-12(N-1). The data read out from the corresponding latch bank 12(0)-12(N-1) is provided as a latch data output 34 from the FIFO memory buffer 10 to be communicated to the read device 26. The read device 26 and the read pointer 24 are clocked by a read clock signal 36. The FIFO memory buffer 10 is an asynchronous memory buffer, because the write clock signal 22 clocking the write pointer 20 and the read clock signal 36 clocking the read pointer 24 are asynchronous to each other.

The FIFO memory buffer 10 in FIG. 1 can be configured to receive data from a CPU, DSP, or other processor write device to be written into the latch banks 12(0)-12(N-1). The data may be read out of the latch banks 12(0)-12(N-1) by a read device, such as a UART provided in a semiconductor die 38 of an integrated circuit (IC) chip. For example, the CPU, DSP, or other processor may be provided as a core device in the semiconductor die 38. In this configuration, the processor is the write device 16, and the UART is the read device 26. Alternatively, the FIFO memory buffer 10 in FIG. 1 can be configured to receive data from a UART to be written into the latch banks 12(0)-12(N-1) and read out of the latch banks 12(0)-12(N-1) by a CPU, DSP, or other processor. In this configuration, the UART is the write device 16, and the processor is the read device 26.

SUMMARY OF THE DISCLOSURE

Embodiments disclosed herein include dual-voltage domain memory buffers, and related systems and methods. As a non-limiting example, the dual-voltage memory buffer may be an asynchronous first-in, first-out (FIFO) latch bank buffer provided in a processor, configured to asynchronously store write data in latch banks and read the data out of the latch banks. To reduce area needed for voltage level shifters for voltage level shifting between the voltage domains of the memory buffer, the latch banks are provided in a voltage domain of memory buffer read circuitry, separate from the voltage domain of a write data input to the latch banks. A write data input voltage level shifter is disposed between the write data input and the latch banks to voltage level shift write data on the write data input to the voltage domain of the latch banks. In this manner, voltage level shifters are not required to voltage level shift the latch bank outputs, because the latch banks are in the voltage domain of the memory buffer read circuitry. The write data input voltage level shifter allows the latch bank to be provided in a separate voltage domain and avoid providing a plurality of voltage level shifters for each of the latch bank outputs. In this manner, semiconductor area that would otherwise be needed for the voltage level shifters to voltage level shift the latch bank outputs is not required.

In this regard in one embodiment, a dual-voltage domain memory buffer is provided. The dual-voltage domain memory buffer comprises a plurality of latch banks provided in a first voltage domain. The dual-voltage domain memory buffer also comprises a write data input provided in a second voltage domain, the write data input configured to provide write data to be written to a latch bank among the plurality of latch banks. The dual-voltage domain memory buffer also comprises a write date input voltage level shifter disposed between the written data input and the plurality, of latch banks. The write data input voltage level shifter is configured to voltage level shift write data on the write data input from the second voltage domain to the first voltage domain. Further, in certain embodiments, the dual-voltage domain memory buffer further comprises a clock input provided in the second voltage domain, the clock input configured to provide a clock signal to clock the plurality of latch banks. The dual-voltage domain memory buffer also comprises a clock input voltage level shifter disposed between the clock input and the plurality of latch banks. The clock input voltage level shifter is configured to voltage level shift the clock signal on the clock input from the second voltage domain to the first voltage domain.

In another embodiment, a dual-voltage domain memory buffer is provided. The dual-voltage domain memory buffer is comprised of a plurality of latch bank means for storing latched data. The plurality of latch bank means is provided in a first voltage domain. The dual-voltage domain memory buffer also comprises a write data input means provided in a second voltage domain, the write data input means for providing write data to be written to the one of the plurality of the latch banks. The dual-voltage domain memory buffer also comprises a write data input voltage level shifting means disposed between the write data input means and the plurality of latch banks means. The write data input voltage level shifter means is for voltage level shifting write data from the write data input means from the second voltage domain to the first voltage domain.

In another embodiment, a method of accessing a dual-voltage domain memory buffer is provided. The method comprises providing write data on a write data input provided in a second voltage domain to a plurality of latch banks in a first voltage domain. The method also comprises voltage level shifting via a write data input voltage level shifter disposed between the write data input and the plurality of latch banks, the write data on the write data input from the second voltage domain to the first voltage domain. The method also comprises writing the voltage level shifted write data to a latch bank among the plurality of latch banks in the first voltage domain.

In another embodiment, a non-transitory computer-readable medium is provided having stored thereon computer-executable instructions to cause a processor to access a dual-voltage domain memory buffer. The computer-executable instructions also cause the processor to provide write data on a write data input provided in a second voltage domain to a plurality of latch banks in a first voltage domain. The computer-executable instructions also cause the processor to voltage level shift via a write data input voltage level shifter disposed between the write data input and the plurality of latch banks, the write data on the write data input from the second voltage domain to the first voltage domain. The computer-executable instructions also cause the processor to write the voltage level shifted write data to a latch bank among the plurality of latch banks in the first voltage domain.

Also in some non-limiting embodiments, the memory buffer latch banks and/or voltage level shifters for inputs into the latch banks may be provided as a hard macro in a semiconductor die containing the memory buffer as opposed to random placement on the semiconductor die. Providing hard macro placement(s) of the latch banks and voltage level shifters exerts more control over the process variations to ensure timing specifications or requirements for the memory buffers are met.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed herein include dual-voltage domain memory buffers, and related systems and methods. As a non-limiting example, the dual-voltage memory buffer may be an asynchronous first-in, first-out (FIFO) latch bank buffer provided in a processor, configured to asynchronously store write data in latch banks and read the data out of the latch banks. To reduce area needed for voltage level shifters for voltage level shifting between the voltage domains of the memory buffer, the latch banks are provided in a voltage domain of memory buffer read circuitry, separate from the voltage domain of a write data input to the latch banks. A write data input voltage level shifter is disposed between the write data input and the latch banks to voltage level shift write data on the write data input to the voltage domain of the latch banks. In this manner, voltage level shifters are not required to voltage level shift the latch bank outputs, because the latch banks are in the voltage domain of the memory buffer read circuitry. The write data input voltage level shifter allows the latch bank to be provided in a separate voltage domain and avoid providing a plurality of voltage level shifters for each of the latch bank outputs. In this manner, semiconductor area that would otherwise be needed for the voltage level shifters to voltage level shift the latch bank outputs is not required.

Figure 2A:
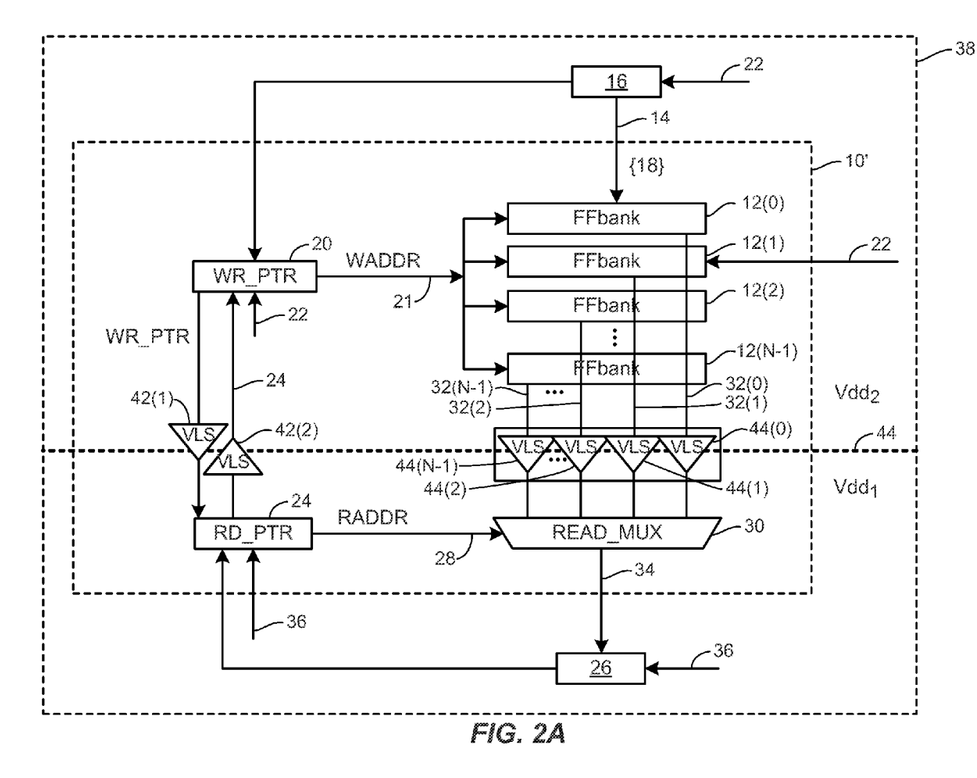
FIG. 2A is an exemplary dual-voltage domain FIFO memory buffer.
Figure 2B:
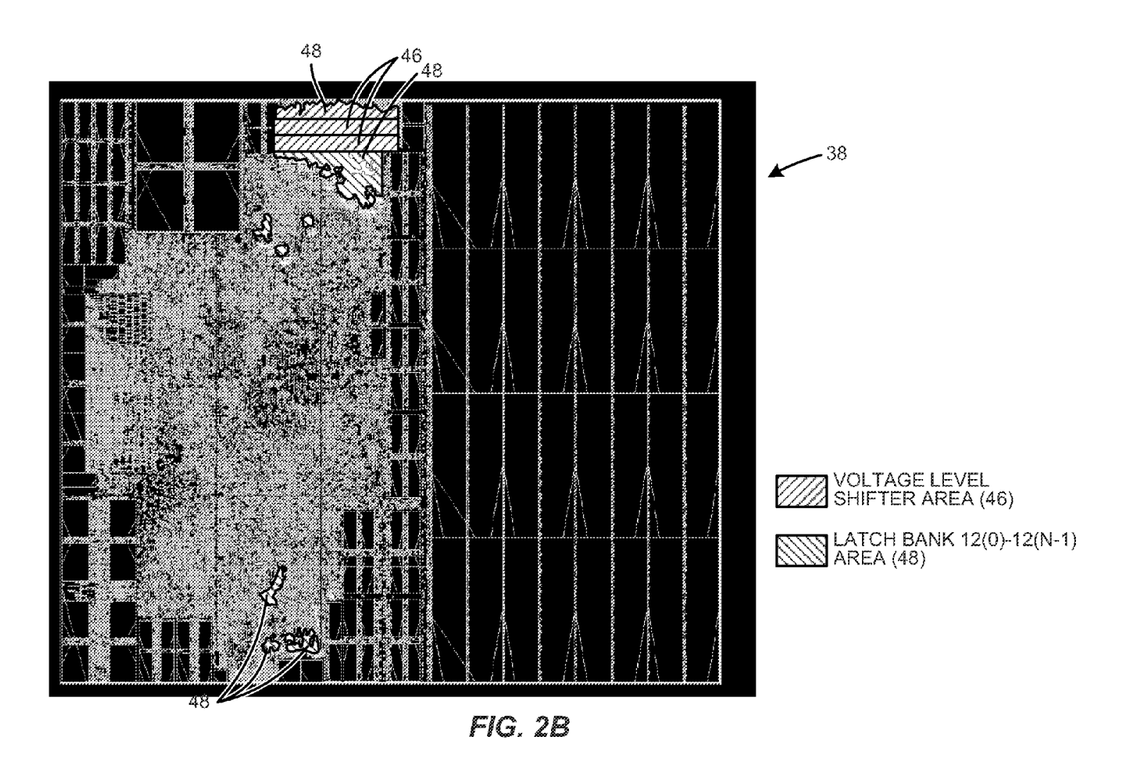
FIG. 2B is a diagram of areas of a semiconductor die occupied by latch banks and voltage level shifters of the dual-voltage domain FIFO memory buffer in FIG. 2A.
Figure 3:
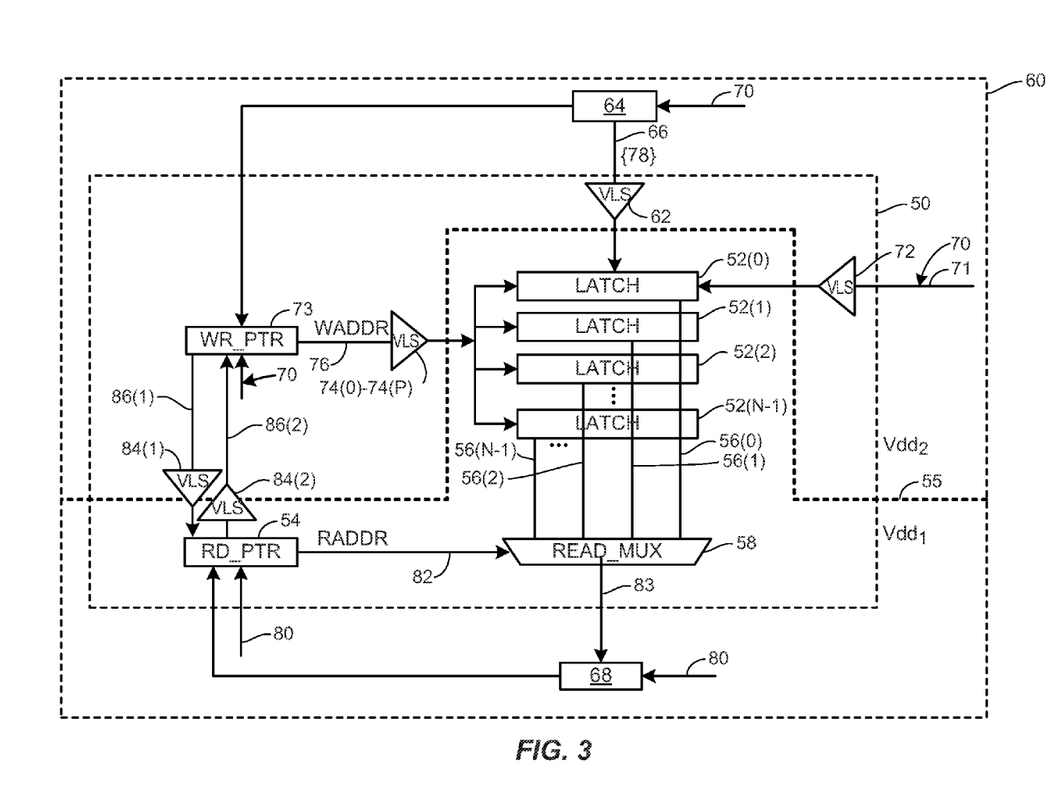
FIG. 3 is an exemplary dual-voltage domain asynchronous FIFO memory buffer having a voltage level shifted data input configured to avoid or reduce latch output voltage domain level shifters, and thereby reduce an area in a semiconductor die containing the FIFO memory buffer.

In this regard, before discussing examples of memory buffers that provide a write data input voltage level shifter disposed between a write data input and latch banks to voltage level shift write data on the write data input to the voltage domain of the latch banks starting at FIG. 3, FIGS. 2A and 2B are first described. FIG. 2A illustrates an exemplary dual-voltage domain asynchronous memory buffer 10' (hereinafter "memory buffer 10'"). For example, the memory buffer 10' may be a FIFO memory buffer similar to the FIFO memory buffer 10 in FIG. 1. Common elements are illustrated and provided with common element numbers between the FIFO memory buffer 10 and memory buffer 10' in FIGS. 1 and 2A. In the memory buffer 10' in FIG. 2A, multiple voltage domains are provided. In this example, a first voltage domain Vdd1 and a second voltage domain Vdd2 are provided in the memory buffer 10' to provide a dual-voltage domain configuration. The first and second voltage domains Vdd1, Vdd2 are noted by the voltage domain dividing line 44 in FIG. 2A.

With continuing reference to FIG. 2A, dual-voltage domains are provided in the memory buffer 10'. Providing dual-voltage domains allows the write device 16 and the read device 26 to be provided in different voltage domains for power conservation when possible, or according to operational specifications. For example, the write device 16 may be a processor core, such as a central processing unit (CPU) or digital signal processing (DSP) core. The write device 16 may be provided in a second voltage domain Vdd2 that may be a lower voltage domain than a first voltage domain Vdd1. The voltage level provided in the second voltage domain Vdd2 may be lowered when desired, such as when performance margin exists in the write device 16, to reduce power consumption. The minimum voltage level provided in the second voltage domain Vdd2 should be kept at or above the minimum voltage level for operation of the latch banks 12(1)-12(N−1). The read device 26 may be provided in the first voltage domain Vdd1, as illustrated in FIG. 2A. Providing more than two voltage domains in the memory buffer 10' is also possible.

With continuing reference to FIG. 2A, voltage level shifters (VLSs) 42(1), 42(2) are provided to allow the memory buffer 10' to operate in the first and second voltage domains Vdd1, Vdd2. The write pointer 20 and the read pointer 24 are located in different voltage domains in this embodiment. Thus, the voltage level shifter 42(1) is provided to voltage level shift the write address (WADDR) in the write pointer 20 communicated to the read pointer 24. The voltage level shifter 42(2) is provided to voltage level shift the read address (RADDR) in the read pointer 24 communicated to the write pointer 20. The write address (WADDR) of the write pointer 20 is updated in the read pointer 24 after completion of writing the write data 18 into a particular latch bank 12(0)-12(N−1) selected by the write pointer 20. In this manner, the read device 26 can subsequently read the write data 18 from the just written latch bank 12(0)-12(N−1). Similarly, the read address (RADDR) of the read pointer 24 is updated in the write address (WADDR) of the write pointer 20.

With continuing reference to FIG. 2A, voltage levels shifters 44 are also provided between the latch outputs 32(0)-32(N−1) and the read multiplexor 30. The voltage level shifters 44 voltage level shift the latch outputs 32(0)-32(N−1) from the second voltage domain Vdd2 to the first voltage domain Vdd1. Voltage level shifters 44(0)-44(N−1) are provided for each of the latch outputs 32(0)-32(N−1), as illustrated in FIG. 2A. Providing the voltage level shifters 44(0)-44(N−1) between the latch outputs 32(0)-32(N−1) and the read multiplexor 30 can consume a large amount of area in the semiconductor die 38 if a large number of latch banks 12(0)-12(N−1) are provided in the memory buffer 10'. For example, FIG. 2B illustrates an area 46 consumed by the voltage level shifters 44(0)-44(N−1) and an area 48 consumed by the latch banks 12(0)-12(N−1) of the memory buffer 10' in FIG. 2A in the semiconductor die 38. As discussed above, it may be desired to reduce the area consumed by the memory buffer 10' in the semiconductor die 38. Reducing the area consumed by the memory buffer 10' may also increase performance by reducing distances between components of the memory buffer 10' in the semiconductor die 38.

In this regard, FIG. 3 illustrates another exemplary memory buffer 50. The memory buffer 50 in this example is an asynchronous memory buffer. In the memory buffer 50 in FIG. 3, latch banks 52(0)-52(N−1) are provided in the same voltage domain as a read pointer 54 (READ_PTR). Latch banks 52(1)-52(N−1) may comprise a plurality of individually addressable bit latches, or latch banks addressable in a given byte or word length address according to the design of the latch banks 52(1)-52(N−1). The read pointer 54 is included in a first voltage domain Vdd1 separate from a second voltage domain Vdd2, as indicated by voltage domain divide line 55 in FIG. 3. The latch banks 52(0)-52(N−1) may each comprise one or more flip-flop latches, as a non-limiting example. In this manner, voltage level shifters are not needed and are not included between latch bank outputs 56(0)-56(N−1) of the latch banks 52(0)-52(N−1) and a latch bank read selector 58 (e.g., a multiplexor) (READ_MUX) of the memory buffer 50, in contrast to the voltage level shifters 44(0)-44(N−1) provided in the memory buffer 10' in FIG. 2A. As a result, the area needed in a semiconductor die 60 for the memory buffer 50 may be reduced by reducing the number of voltage level shifters required. To eliminate the need for voltage level shifters between the latch bank outputs 56(0)-56(N−1) and the latch bank read selector 58 in the memory buffer 50 in FIG. 3, a first additional write data input voltage level shifter 62 is provided between a write data input 66 from a write device 64 and the latch banks 52(0)-52(N−1). This first additional write data input voltage level shifter 62 is not included in the memory buffer 10' in FIG. 2A. By providing the first additional write data input voltage level shifter 62 between the data input 66 and the latch banks 52(0)-52(N−1), the write device 64 can remain in a second voltage domain Vdd2 separate from the first voltage domain Vdd1 of a read device 68 in this example.

With continuing reference to FIG. 3, in this embodiment, the write device 64 is provided in the second voltage domain Vdd2 separate from the first voltage domain Vdd1 of the latch banks 52(0)-52(N−1) to avoid the need for voltage level shifters between the latch bank outputs 56(0)-56(N−1) and the latch bank read selector 58. Other voltage level shifters not included in the memory buffer 10' in FIG. 2A are also provided to voltage level shift clocks signals in the memory buffer 50.

In this regard, because a write device clock 70 provided on a clock input 71 is still provided in the second voltage domain Vdd2 in the memory buffer 50, a clock input voltage level shifter 72 is provided between the clock input 71 and the latch banks 52(0)-52(N−1). The clock input voltage level shifter 72 voltage level shifts the write device clock 70 on the clock input 71 from the second voltage domain Vdd2 to the first voltage domain Vdd1 to provide the write device clock 70 in the same voltage domain (i.e., Vdd1) as the latch banks 52(0)-52(N−1) to clock the latch banks 52(0)-52(N−1). The write device clock 70 is also provided to a write pointer 73 (WR_PTR) to clock the write pointer 73 without need for additional voltage level shifting, because the write pointer 73 is in the same second voltage domain Vdd2 of the write device 64. Further, because the latch banks 52(0)-52(N−1) are provided in the first voltage domain Vdd1 separate from the second voltage domain Vdd2 of the write pointer 73, write address input voltage level shifters 74(0)-74(P) are also provided in the memory buffer 50 between the write pointer 73 and the latch banks 52(0)-52(N−1). The write address input voltage level shifters 71(0)-74(P) voltage level shift write address input 76 containing the write address of the write pointer 73 to the first voltage domain Vdd1 to select a particular latch bank 52(0)-52(N−1) in which to write incoming write data 78 from the write data input 66.

With continuing reference to FIG. 3, additional voltage level shifters are not needed for a read device clock 80 provided to the read pointer 54, because the read pointer 54 is included in the same first voltage domain Vdd1 as the read device 68. A read address (RADDR) provided over a read address input 82 by the read pointer 54 as an input into the latch bank read selector 58 to select a particular latch bank 52(0)-52(N−1) does not have to be voltage level shifted in this embodiment. The selected latch bank output 56(0)-56(N−1) is provided as a latch data output 83 from the latch bank read selector 58. Voltage level shifters 84(1), 84(2) are provided to voltage level shift write and read address inputs 86(1), 86(2) communicated from the write pointer 73 to the read pointer 54, and vice versa, as also provided in the memory buffer 10' in FIG. 2A. Thus, the voltage level shifters 84(1), 84(2) do not increase the area needed for voltage level shifters in the semiconductor die 60 over the memory buffer 10' in FIG. 2A.

Thus, in summary, additional voltage level shifters 62, 72, 74(0)-74(P−1) are provided in the memory buffer 50 in FIG. 3 that are not included in the memory buffer 10' in FIG. 2A. However, the memory buffer 50 in FIG. 3 eliminates the need for voltage level shifters on the latch bank outputs 56(0)-56(N−1) between the latch banks 52(0)-52(N−1) and the latch bank read selector 58. As a result, the area needed in the semiconductor die 60 to provide the memory buffer 50 can be reduced over the area needed to provide the memory buffer 10' in the semiconductor die 38 in FIG. 2A. As will be discussed below in more detail, the exact placement of the voltage level shifters 62, 72, 74(0)-74(P) with regard to the latch banks 52(0)-52(N−1) can vary and can be controlled to varying degrees depending on the design of the semiconductor die 60 and timing considerations of the memory buffer 50.

As a result of providing the write device clock 70 on a clock input 71 in a different voltage domain (e.g., Vdd2) from the latch banks 52(0)-52(N−1) in the memory buffer 50 in FIG. 3 (e.g., Vdd1), delay is added when writing to the latch banks 52(0)-52(N−1). Thus, the timing to write the latch banks 52(0)-52(N−1) during latch writes is delayed. Specifically, the clock input voltage level shifter 72 provided to voltage level shift the write device clock 70 on the clock input 71 from the second voltage domain (Vdd2) to the first voltage domain (Vdd1) of the latch banks 52(0)-52(N−1) delays the write device clock 70. Delay is also added when the write address input 76 is voltage level shifted by the write address input voltage level shifters 74(0)-74(P) provided between the write pointer 73 and the latch banks 52(0)-52(N−1). It is important that write data 78 written to a particular latch bank 52(0)-52(N−1) be completed before the write pointer 73 is updated in the read pointer 54 to read out the write data 78 previously written into the latch bank 52(0)-52(N−1). Otherwise, a latch bank read may read data from a latch bank 52(0)-52(N−1) before the data is ready to be read out of the latch bank 52(0)-52(N−1).

Figure 4:
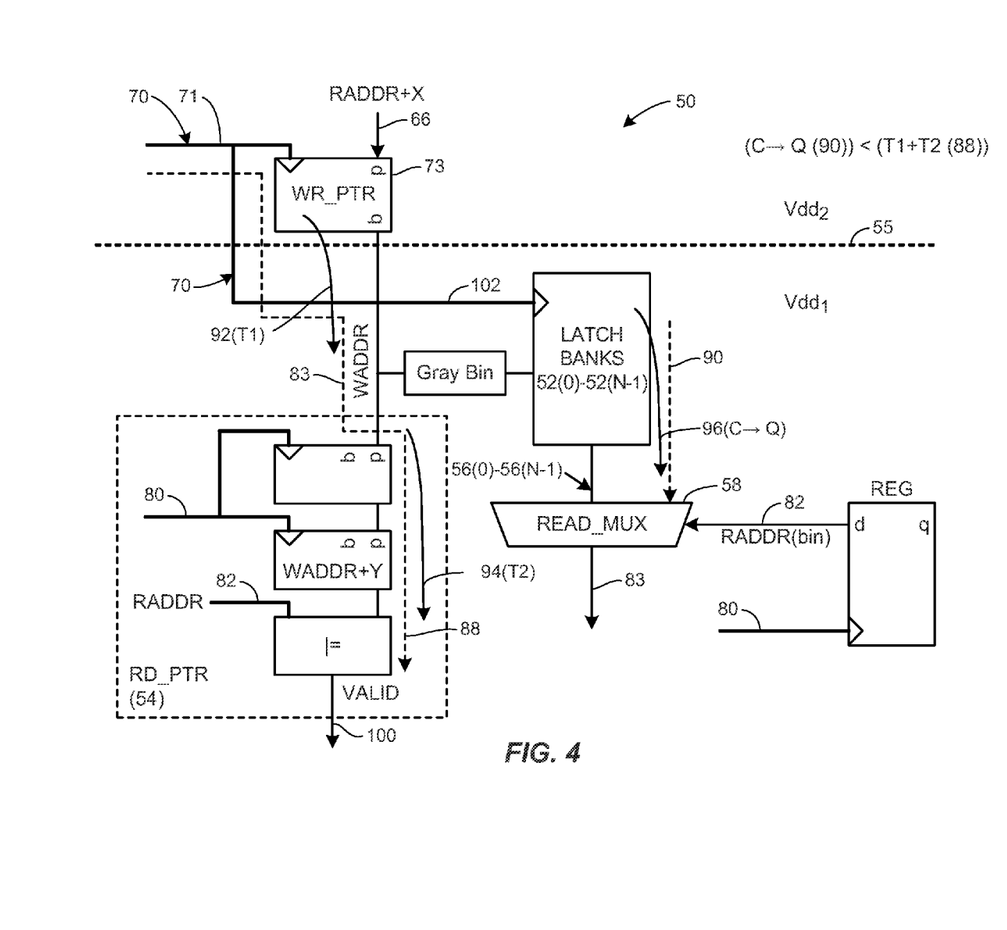
FIG. 4 is a diagram of an exemplary latch bank write address path and latch bank write data path to illustrate timing for writing data to a latch in the FIFO memory buffer in FIG. 3, before the writer pointer is updated in the receiver pointer for reading out the written data from a latch bank of the FIFO memory buffer.

In this regard, FIG. 4 is a diagram of an exemplary latch bank write address path 88 and a latch bank write data path 90 in the memory buffer 50 of FIG. 3 to illustrate exemplary write address and write data timings in the memory buffer 50. The latch bank write address path 88 includes a first write address path portion 92 of the write pointer 73 asserting a write address (WADDR) on the write address input 76 to the latch banks 52(0)-52(N−1). This first write address path portion 92 of the latch bank write address path 88 is signified by timing "T1" in FIG. 4. The latch bank write address path 88 also includes a second write address path portion 94 of the write address (WADDR) of the write pointer 73 being updated as an increment of the write address (WADDR) (i.e., WADDR+Y) in the read pointer 54, indicating that the next latch bank 52 among the latch banks 52(0)-52(N−1) are ready to be read. The second write address path portion 94 is signified by timing "T2" in FIG. 4. An identification of the next latch bank 52 among the latch banks 52(0)-52(N−1) to be read is provided by a valid output 100 resulting from an increment of the write address (WADDR+Y) being updated in the read pointer 54.

With continuing reference to FIG. 4, the latch bank write data path 90 in the memory buffer 50 includes a write data path portion 96 from the latch banks 52(0)-52(N−1) to the latch bank outputs 56(0)-56(N−1) and the latch bank read selector 58, as illustrated in FIG. 4. This write data path portion 96 is signified by the timing "C→Q" in FIG. 4. The latch banks 52(0)-52(N−1) are enabled by a write enable 102 for writing. An identification of the next latch bank 52 among the latch banks 52(0)-52(N−1) to be written is provided as an increment of the read address (RADDR+X) being updated in the write pointer 73.

The timing of the latch bank write data path 90 (i.e., C→Q) in the memory buffer 50 is designed to be less than the latch bank write address path 88 (i.e., T1+T2). This is so the write data 78 written into a latch bank 52(0)-52(N−1) is completed before an increment of the write address (WADDR+Y) of the write pointer 73 is updated in the read pointer 54. The data written to the latch bank 52(0)-52(N−1) can be read out when an increment of the write address (WADDR+Y) of the write pointer 73 is updated in the read pointer 54. Thus, it is important that the data written into the latch bank 52(0)-52(N−1) is completed before being read out of the latch bank 52(0)-52(N−1). Thus, the timing of the latch bank write data path 90 (i.e., C→Q) should be designed to be less than the latch bank write address path 88 (i.e., T1+T2) regardless of whether the write device clock 70 is slower or faster than the read device clock 80, so that the clock speed of the write device 64 can be reduced to conserve power and increase performance, respectively, as desired.

Figure 5A:
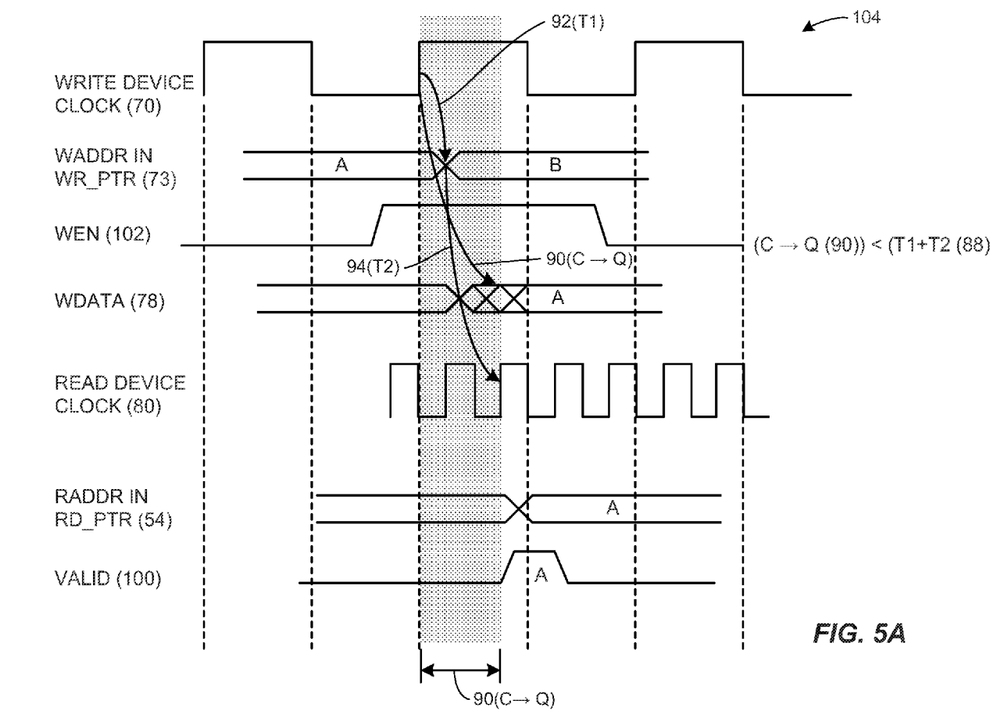
FIG. 5A is an exemplary timing diagram that illustrates exemplary path timing specifications being maintained when writing data to a latch bank in the FIFO memory buffer in FIG. 3 when the write device clock is slower than the read device clock.
Figure 5B:
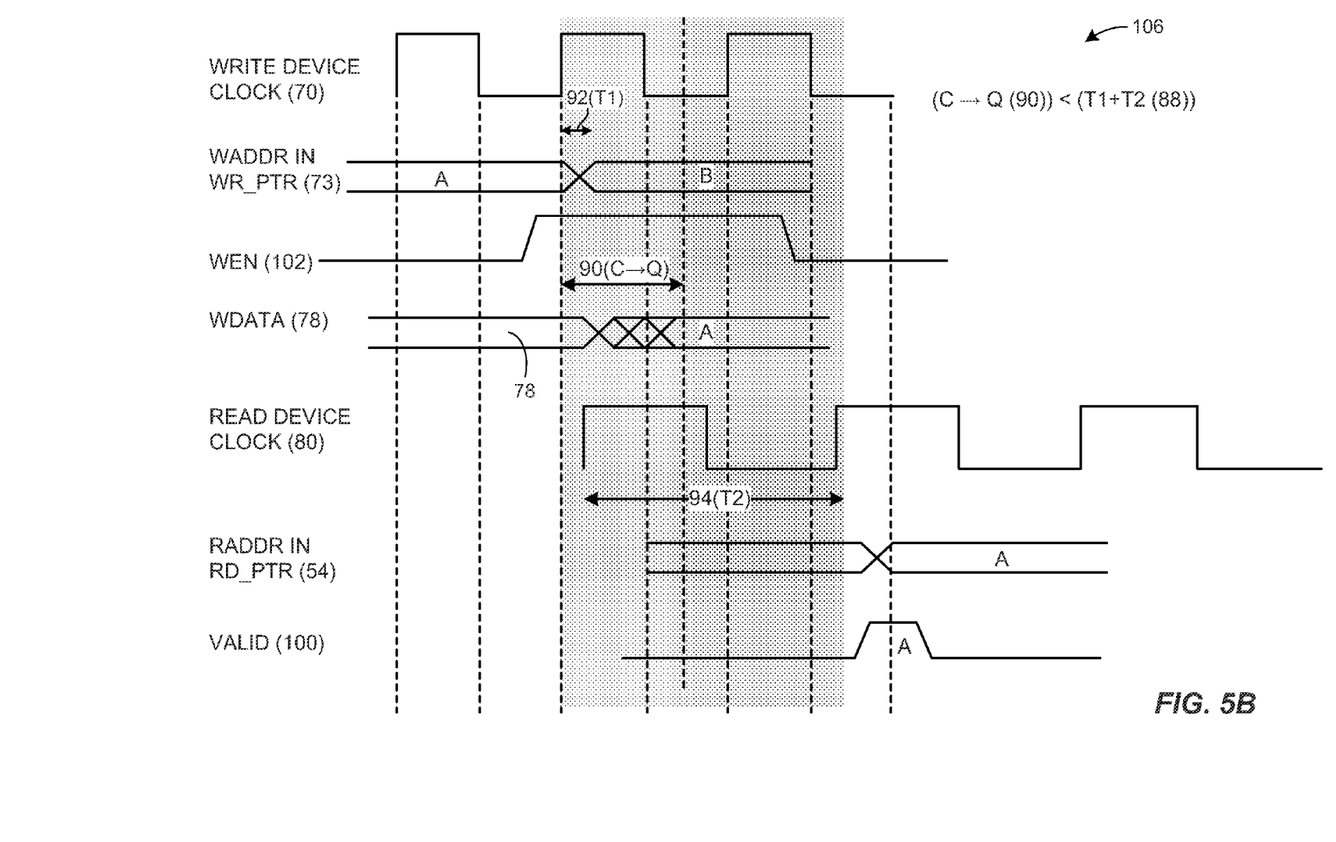
FIG. 5B is an exemplary timing diagram that illustrates exemplary timing specifications maintained when writing data to a latch bank in the FIFO memory buffer in FIG. 3 when the write device clock is faster than the read device clock.

FIG. 5A is an exemplary timing diagram 104 that illustrates exemplary timing requirements maintained when writing write data 78 to a latch bank 52(0)-52(N−1) in the memory buffer 50 in FIG. 3 when the write device clock 70 is slower than the read device clock 80. As illustrated in FIG. 5A, the writing of the write data 78 into a latch bank 52(0)-52(N−1), signified by the latch bank write data path 90 (i.e., C→Q), is completed before the read address (RADDR) in the read pointer 54 is updated with an increment of the write address (WADDR+Y) in the write pointer 73 according to the latch bank write address path 88 (i.e., T1+T2), and the valid, output 100 is activated. The timing of the latch bank write address path 88 (i.e., T1+T2) is greater than the latch bank write data path 90 (i.e., C→Q). FIG. 5B is an exemplary timing diagram 106 that illustrates exemplary timing requirements maintained when writing write data 78 to a latch bank 52(0)-52(N−1) in the memory buffer 50 in FIG. 3 when the write device clock 70 is faster than the read device clock 80. Again, as illustrated in FIG. 5B, the writing of the write data 78 into a latch bank 52(0)-52(N−1), signified by the latch bank write data path 90 (i.e., C→Q), is completed before the read address (RADDR) in the read pointer 54 is updated with an increment of the write address (WADDR+Y) in the write pointer 73 according to the latch bank write address path 88 (i.e., T1+T2), and the valid output 100 is activated.

The added delay incurred by inclusion of the additional voltage level shifters 62, 72, and 74(0)-74(P) in the memory buffer 50 in FIG. 3 is taken into consideration when providing timing requirements to ensure the latch bank write data path 90 (i.e., C→Q) is faster than the latch bank write address path 88 (i.e., T1+T2). As discussed above, the voltage level shifters 62, 74(0)-74(P) delay latch bank 52(0)-52(N−1) writes. The clock input voltage level shifter 72 delays latch bank 52(0)-52(N−1) access for latch bank writes and reads. Thus, it may be desirable to reduce the delay of the voltage level shifters 62, 72, 74(0)-74(P) as much as possible to reduce latch bank write and read delays and to meet the timing requirements discussed above with regard to FIGS. 4-5B.

Also, other factors may cause delays in the additional voltage level shifters 62, 72, 74(0)-74(P) to vary between each other, thus making it more difficult to meet timing requirements without sacrificing performance of the memory buffer 50. For example, process variations may occur when the voltage level shifters 62, 72, 74(0)-74(P) are fabricated on the semiconductor die 60, which can vary delay. Further, variations in delays in the voltage level shifters 62, 72, 74(0)-74(P) may occur by variations in placement of the voltage level shifters 62, 72, 74(0)-74(P) in the semiconductor die 60. For example, some of the voltage level shifters 62, 72, 74(0)-74(P) may be located, in the semiconductor die 60 at greater distances from their respective inputs and output nodes than others of the voltage level shifters 62, 72, 74(0)-74(P). This can cause delay variations between the different voltage level shifters 62, 72, 74(0)-74(P). Thus, it may be desired to provide additional features in the memory buffer 50 of FIG. 3 that reduce delays in the voltage level shifters 62, 72, 74(0)-74(P) and also reduce delay variations between the voltage level shifters 62, 72, 74(0)-74(P).

Figure 6:
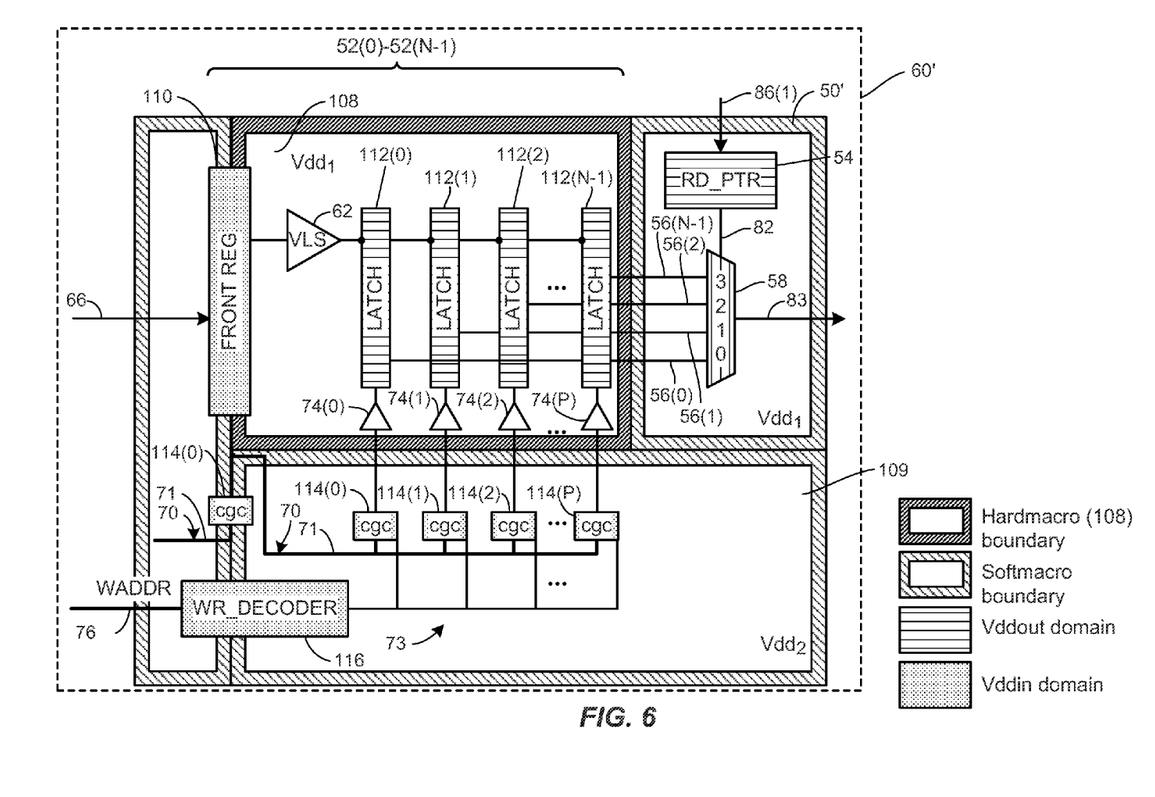
FIG. 6 is another exemplary dual-voltage domain asynchronous FIFO memory buffer having a voltage level shifted data input, and with certain components of the FIFO memory buffer provided in a hard macro area in a semiconductor die to more precisely control timing paths for writing data to a latch in the FIFO memory buffer.

In this regard. FIG. 6 illustrates another exemplary dual-voltage domain asynchronous memory buffer 50' (hereinafter "memory buffer 50'"). Common components between the memory buffer 50' in FIG. 6 and the memory buffer 50 in FIG. 3 are similarly numbered. Like the memory buffer 50 in FIG. 3, the memory buffer 50' in FIG. 6 also includes a write data input voltage level shifter 62 in a write data input 66' to avoid, or reduce voltage domain level shifters for outputs of the latch banks 52(0)-52(N−1). However in this embodiment, a hard macro 108 is provided for the memory buffer 50' in FIG. 6 to control placement of the voltage level shifters 62, 72, 74(0)-74(P) in a semiconductor die 60'. This is opposed to random placement of the voltage level shifters 62, 72, 74(0)-74(P) in the semiconductor die 60 in FIG. 3. Controlling placement of the voltage level shifters 62, 72, 74(0)-74(P) in the semiconductor die 60' of FIG. 6 can be used to reduce distances between the voltage level shifters 62, 72, 74(0)-74(P) and the latch banks 52(0)-52(N−1) to reduce distance delays. Reducing delay in the voltage level shifters 62, 72, 74(0)-74(P) can reduce the skew of signals voltage level shifted by the voltage level shifters 62, 72, 74(0)-74(P).

Further, including the voltage level shifters 62, 72, 74(0)-74(P) in the hard macro 108 on the semiconductor die 60' also reduces or avoids process variations between voltage level shifters 62, 72, 74(0)-74(P). Reducing or avoiding process variations between voltage level shifters 62, 72, 74(0)-74(P) can provide greater predictability in timing behaviors in paths including the voltage level shifters 62, 72, 74(0)-74(P). Reducing or avoiding process variations between voltage level shifters 62, 72, 74(0)-74(P) can be useful in ensuring satisfaction of timing requirements, including those discussed above. Reducing or avoiding process variations between voltage level shifters 62, 72, 74(0)-74(P) may avoid or reduce the need for additional compensating buffers to equalize variation in delay contributions by the voltage level shifters 62, 72, 74(0)-74(P) in time sensitive paths.

With continuing reference to FIG. 6, the hard macro 108 is provided in the semiconductor die 60' to precisely control the layout and placement of the latch banks 52(0)-52(N−1) and the voltage level shifter 62 for the write data input 66' in the semiconductor die 60'. Other components of the memory buffer 50' that do not need the same precision in location with regard to latch banks 52(0)-52(N−1) as components included in the hard macro 108 are included in a soft macro 109 in this embodiment. In this embodiment, a data input register 110 and latches 112(0)-112(N−1) are provided in the hard macro 108 that comprise the latch banks 52(0)-52(N−1) of the memory buffer 50'. Also in this embodiment, the write data input voltage level shifter 62 is also placed in the hard macro 108 between the data input register 100 and the latches 112(0)-112(N−1) to locate the write data input voltage level shifter 62 close to the latches 112(0)-112(N−1) to reduce delay and the skew of signals voltage level shifted by the write data input voltage level shifter 62.

With continuing reference to FIG. 6, the write address input voltage level shifters 74(0)-74(P) in the memory buffer 50' are placed in the hard macro 108 to control their location and thus reduce delay. In this embodiment, the write address input voltage level shifters 74(0)-74(P) are placed between the latches 112(0)-112(N−1) and write pointer registers 114(0)-114(P) that are included in the write pointer 73. The write pointer 73 also includes a write address decoder 116 (WR_DECODER) that decodes the write address (WADDR) provided on the write address 76. In this embodiment, the write address input 76 is provided in the soft macro 109 farther away from the latches 112(0)-112(N−1) to provide performance margin in the latch bank write address path 88 (i.e., T1+T2) (see FIG. 4). The write address decoder 116 decodes the write address (WADDR) to select one of the latches 112(0)-112(N−1) to be written during a latch write. The write address input voltage level shifters 74(0)-74(P) voltage level shift the write address (WADDR) from the write address decoder 116 to provide the write address (WADDR) in the first voltage domain Vdd1 of the hard macro 108. Also note that even through the latch bank read selector 58 is not located in the hard macro 108, the read multiplexor 58 is provided in the first voltage domain Vdd1. Thus, as provided in the memory buffer 50 in FIG. 3, voltage level shifters are not required and not provided between the latch bank outputs 56(0)-56(N−1) and the read multiplexor 58.

Figure 7:
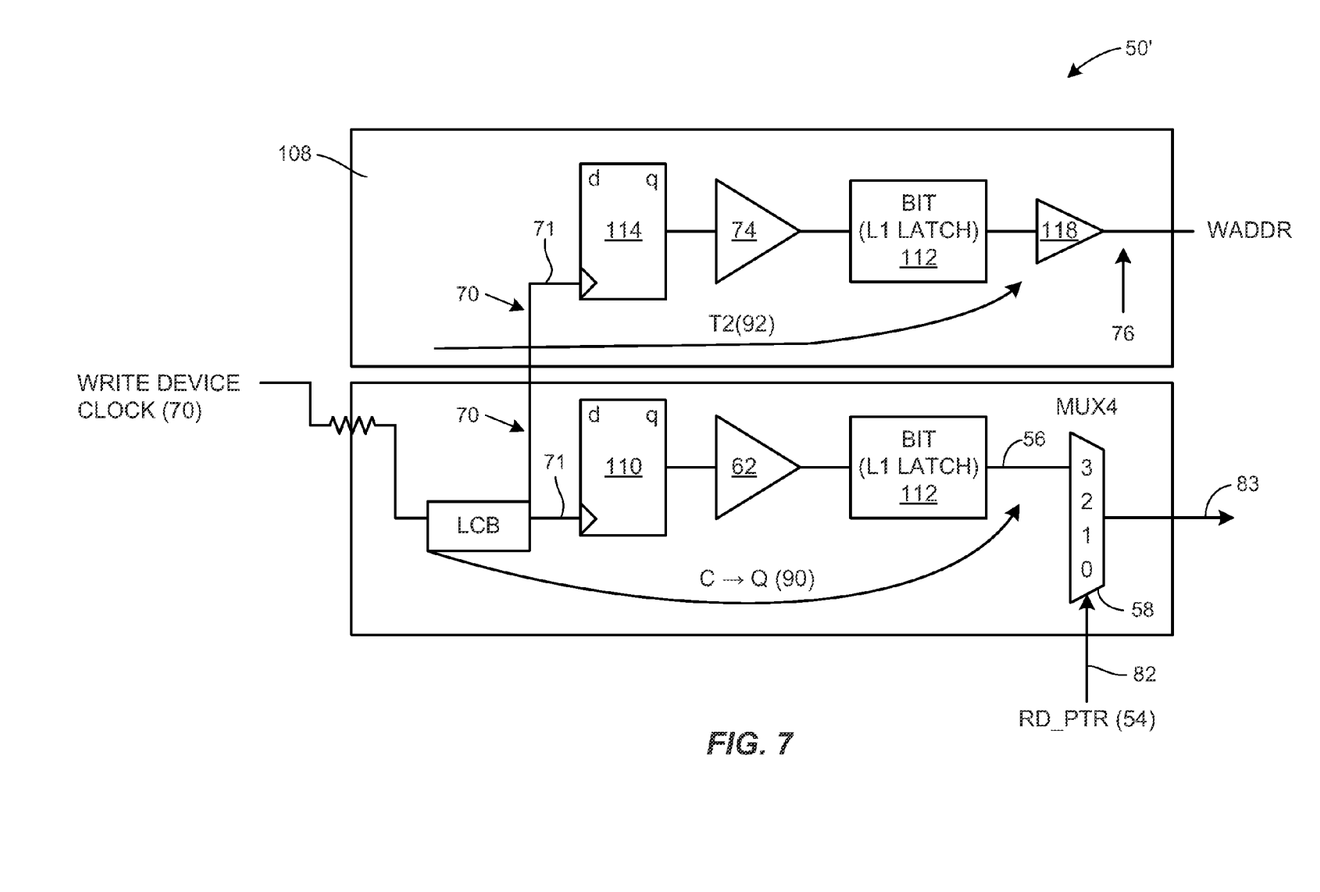
FIG. 7 illustrates exemplary balanced timing paths for the latch bank write address path and the latch bank write data path in the FIFO memory buffer of FIG. 4 as one technique to comply with timing specifications.

Even with the placement of the voltage level shifters 62, 74(0)-74(P) of the memory buffer 50' in the hard macro 108 to be located close to the latches 112(0)-112(N−1) as illustrated in FIG. 6, signal paths still may not provide timing of the latch bank write data path 90 (i.e., C→Q) to always be less than the timing of the latch bank write address path 88 (i.e., T1+T2) in this regard as illustrated in FIG. 7, the timing of the first write address path portion 92 (i.e., T1) of the latch bank write address path 88 can be balanced with the timing of the latch bank write data path 90 (i.e., C→Q). In this manner, the timing of the latch bank write data path 90 (i.e., C→Q) will always be faster than the timing of the latch bank write address path 88 (i.e., T1+T2), because of the additional timing provided by the second write address path portion 92 (i.e., T2) of the latch bank write address path 88. As illustrated in FIG. 7, a buffer 118 is provided in the first write address path portion 92 (i.e., T1) to delay the write address (WADDR) to be updated in the read pointer 54 (see also, FIG. 4 above). The buffer 118 is also placed in the hard macro 108 in this embodiment to control the delay provided by the buffer 118. The buffer 118 does reduce performance of the first write address path portion 92 (i.e., T1). Buffers may also be included in only the latch bank write address path 88 (i.e., T1+T2), only the latch bank write data path 90 (i.e., C→Q), or both the latch bank write address path 88 (i.e., T1+T2) and the latch bank write data path 90 (i.e., C→Q), as needed. Other techniques may be employed in the memory buffer 50' in FIG. 6 to balance delay paths to ensure timing specifications of the latch bank write address path 88 timing (i.e., T1+T2) being slower than the latch bank write data path 90 timing (i.e., C→Q).

The dual-voltage domain memory buffers according to concepts and embodiments discussed herein, including memory buffers 50 and 50', may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 8:
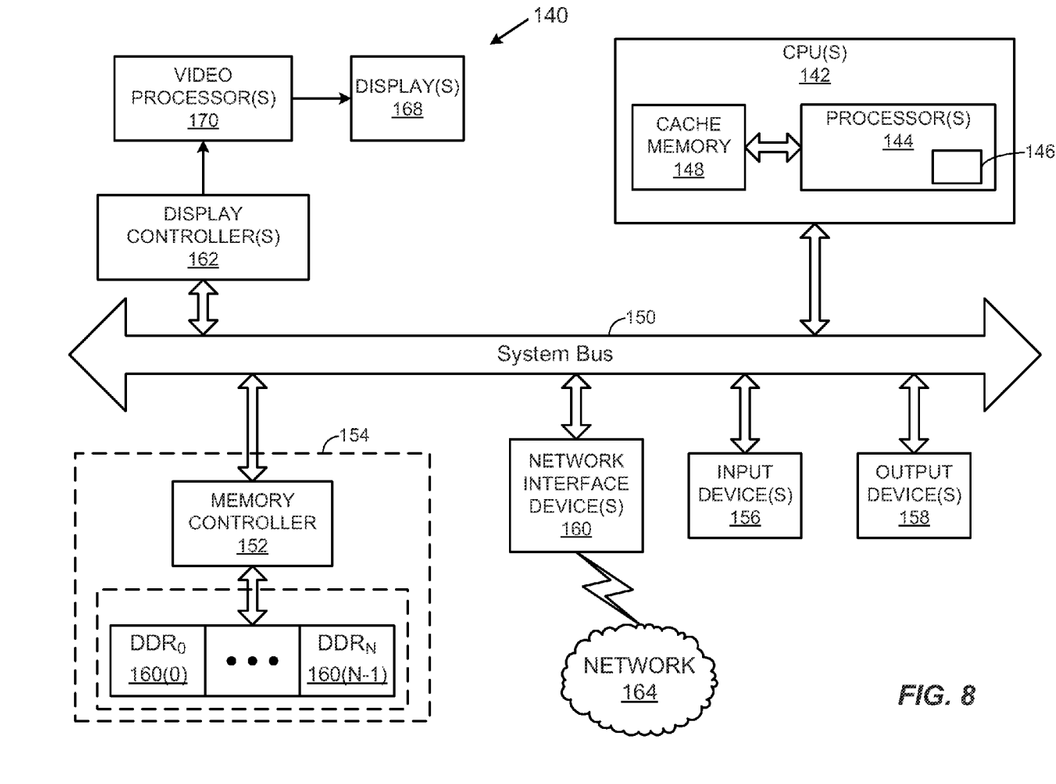
FIG. 8 is a block diagram of an exemplary processor-based system that can include dual-voltage domain asynchronous FIFO memory buffers according to the embodiments disclosed herein.

In this regard, FIG. 8 illustrates an example of a processor-based system 140. In this example, the processor-based system 140 includes one or more central processing units (CPUs) 142, each including one or more processors or cores 144. The CPUs 142 may include one or more dual-voltage domain asynchronous memory buffers 146, which may include the memory buffers 50 or 50' discussed above. The CPU(s) 142 may have cache memory 148 coupled to the processor(s) 144 for rapid access to temporarily stored data. The CPU(s) 142 is coupled to a system bus 150 and can intercouple master and slave devices included in the processor-based system 140. As is well known, the CPU(s) 142 communicates with these other devices by exchanging address, control, and data information over the system bus 150. For example, the CPU(s) 142 can communicate bus transaction requests to a memory controller 152 as an example of a slave device. Although not illustrated in FIG. 8, multiple system buses 150 could be provided, wherein each system bus 150 constitutes a different fabric.

Other master and slave devices can be connected to the system bus 150. As illustrated in FIG. 8, these devices can include a memory system 154, one or more input devices 156, one or more output devices 158, one or more network interface devices 160, and one or more display controllers 162, as examples. The input device(s) 156 can include any type of input device, including but not limited to input keys, switches, voice processors, etc. The output device(s) 158 can include any type of output device, including but not limited to audio, video, other visual indicators, etc. The network interface device(s) 160 can be any devices configured to allow exchange of data to and from a network 164. The network 164 can be any type of network, including but not limited to a wired or wireless network, a private or public network, a local area network (LAN), a wide local area network (WLAN), and the Internet. The network interface device(s) 160 can be configured to support any type of communication protocol desired. The memory system 154 can include one or more memory units 166(0)-166(N−1).

The CPUs 142 may also be configured to access the display controller(s) 162 over the system bus 150 to control information sent to one or more displays 168. The display controller(s) 162 sends information to the display(s) 168 to be displayed via one or more video processors 170, which process the information to be displayed into a format suitable for the display(s) 168. The display(s) 168 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments of dual voltage domain memory buffers disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

As non-limiting examples, the dual voltage domain memory buffers disclosed herein may include various means. The dual voltage domain memory buffers may include the dual voltage memory buffer 50 in FIG. 3 and the dual voltage memory buffer 50' in FIG. 6 as non-limiting examples of dual voltage memory buffer means. The plurality of latch bank means for storing latched data in dual-voltage domain memory buffers disclosed herein may be the latch banks 52(0)-52(N−1) in FIGS. 3 and 6, as non-limiting examples. The dual-voltage domain memory buffers may also comprise a write data input means provided in a second voltage domain such as write data input 66 in FIG. 3 and write data input 66' in FIG. 6, as non-limiting examples. The write data input means is for providing write data to be written to the one of the plurality of the latch banks. The dual-voltage domain memory buffers may also comprise a write data input voltage level shifting means disposed between the write data input means and the plurality of latch banks means, for example write data input voltage level shifter 62 in FIGS. 3 and 6, as non-limiting examples. The write data input voltage level shifter means is for voltage level shifting write data from the write data input means from the second voltage domain to the first voltage domain.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Iii the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled, in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A dual-voltage domain memory buffer, comprising:
    a plurality of latch banks provided in a first voltage domain;
    a write data input provided in a second voltage domain, the write data input configured to provide write data to be written to a latch bank among the plurality of latch banks; and
    a write data input voltage level shifter disposed between the write data input and the plurality of latch banks, the write data input voltage level shifter configured to voltage level shift the write data on the write data input from the second voltage domain to the first voltage domain.

2. The dual-voltage domain memory buffer of claim 1, further comprising:
    a clock input provided in the second voltage domain, the clock input configured to provide a clock signal to clock the plurality of latch banks; and
    a clock input voltage level shifter disposed between the clock input and the plurality of latch banks, the clock input voltage level shifter configured to voltage level shift the clock signal on the clock input from the second voltage domain to the first voltage domain.

3. The dual-voltage domain memory buffer of claim 2, wherein the clock input is configured to receive the clock signal from a write device.

4. The dual-voltage domain memory buffer of claim 1, further comprising:
    a write address input provided in the second voltage domain, the write address input configured to provide a write address to the plurality of latch banks; and
    a plurality of write address input voltage level shifters disposed between the write address input and the plurality of latch banks, the plurality of write address input voltage level shifters configured to voltage level shift the write address on the write address input from the second voltage domain to the first voltage domain.

5. The dual-voltage domain memory buffer of claim 4, further comprising a write pointer configured to store the write address and provide the write address on the write address input to provide the write address to the plurality of latch banks.

6. The dual-voltage domain memory buffer of claim 5, further comprising at least one buffer configured to delay the write address on the write address input.

7. The dual-voltage domain memory buffer of claim 5, further comprising at least one register configured to store and delay the write address on the write address input.

8. The dual-voltage domain memory buffer of claim 5, further comprising a read pointer configured to receive an increment of the write address from a write address input of the write pointer as a read address from which to read out data from the plurality of latch banks.

9. The dual-voltage domain memory buffer of claim 8, wherein the read pointer is provided in the first voltage domain, and further comprising a voltage level shifter disposed between the read pointer and the write pointer, the voltage level shifter configured to voltage level shift the read address from the first voltage domain to the second voltage domain.

10. The dual-voltage domain memory buffer of claim 8 configured to write the write data to a latch bank at the write address among the plurality of latch banks faster than the read pointer receives the increment of the write address from the write address input of the write pointer as the read address from which to read out the data from the plurality of latch banks.

11. The dual-voltage domain memory buffer of claim 8, further comprising a latch bank read selector configured to:
    receive the read address from a read address input provided in the first voltage domain; and
    select a latch bank among the plurality of latch banks to read out the data stored in the selected latch bank at the read address.

12. The dual-voltage domain memory buffer of claim 5, wherein the write pointer is provided in the second voltage domain, and further comprising a voltage level shifter disposed between the write pointer and the read pointer, the voltage level shifter configured to voltage level shift the write address from the second voltage domain to the first voltage domain.

13. The dual-voltage domain memory buffer of claim 1, further comprising:
    a register provided in the second voltage domain, the register configured to receive and store the write data over the write data input;
    the plurality of latch banks comprising a plurality of latches configured to receive the write data from the register; and the write data input voltage level shifter disposed between the register and the plurality of latches to voltage level shift the write data on the write data input from the second voltage domain to the first voltage domain.

14. The dual-voltage domain memory buffer of claim 1 integrated into a semiconductor die.

15. The dual-voltage domain memory buffer of claim 1, wherein the plurality of latch banks and the write data input voltage level shifter are provided in a hard macro in a semiconductor die.

16. The dual-voltage domain memory buffer of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the dual-voltage domain memory buffer is integrated.

17. A dual-voltage domain memory buffer, comprising:
a plurality of means for storing latched data, the plurality of means for storing latched data provided in a first voltage domain;
means for receiving write data provided in a second voltage domain, the means for receiving write data configured to provide write data to be written to one of the plurality of means for storing latched data; and
means for voltage level shifting disposed between the means for receiving write data and the plurality of means for storing latched data, the means for voltage level shifting configured to voltage level shift the write data from the means for receiving write data from the second voltage domain to the first voltage domain.

18. A method of accessing a dual-voltage domain memory buffer, comprising:
providing write data on a write data input provided in a second voltage domain to a plurality of latch banks in a first voltage domain;
voltage level shifting via a write data input voltage level shifter disposed between the write data input and the plurality of latch banks, the write data on the write data input from the second voltage domain to the first voltage domain; and
writing the voltage level shifted write data to a latch bank among the plurality of latch banks in the first voltage domain.

19. The method of claim 18, further comprising:
providing a clock signal on a clock input provided in the second voltage domain; and
voltage level shifting, via a clock input voltage level shifter disposed between the clock input and the plurality of latch banks, the clock signal on the clock input from the second voltage domain to the first voltage domain; and
clocking the plurality of latch banks based on the voltage level shifted clock signal.

20. The method of claim 19, further comprising:
providing a write address on a write address input provided in the second voltage domain;
voltage level shifting, via a plurality of write address input voltage level shifters disposed between the write address input and the plurality of latch banks, the write address on the write address input from the second voltage domain to the first voltage domain; and
providing the voltage level shifted write address to the plurality of latch banks to write address the plurality of latch banks.

21. The method of claim 20, further comprising:
receiving a read address from a read address input provided in the first voltage domain;
providing the read address on the read address input to a latch bank read selector; and
the latch bank read selector selecting a latch bank among the plurality of latch banks to read out data stored in the selected latch bank at the read address.

22. The method of claim 21, comprising providing the voltage level shifted write address to the plurality of latch banks to write address the plurality of latch banks before providing the read address on the read address input to the latch bank read selector.

23. The method of claim 22, wherein providing the read address on the read address input to the latch bank read selector comprises:
providing the voltage level shifted write address in a first write address path portion to delay the write address;
updating a read pointer with the delayed voltage level shifted write address; and
providing the delayed voltage level shifted write address from the read pointer as the read address to the latch bank read selector.

24. A non-transitory computer-readable medium having stored thereon computer-executable instructions to cause a processor to access a dual-voltage domain memory buffer by causing the processor to:
provide write data on a write data input provided in a second voltage domain to a plurality of latch banks in a first voltage domain;
voltage level shift via a write data input voltage level shifter disposed between the write data input and the plurality of latch banks, the write data on the write data input from the second voltage domain to the first voltage domain; and
write the voltage level shifted write data to a latch bank among the plurality of latch banks in the first voltage domain.

* * * * *